United States Patent
Hernandez

(10) Patent No.: US 9,651,576 B2
(45) Date of Patent: May 16, 2017

(54) LOW-SIDE COAXIAL CURRENT PROBE

(71) Applicant: Thermo KeyTek LLC, Wilmington, MA (US)

(72) Inventor: Marcos Hernandez, San Jose, CA (US)

(73) Assignee: Thermo Keytek LLC, Wilmington, MA (US)

( * ) Notice: Subject to any disclaimer, the term of this patent is extended or adjusted under 35 U.S.C. 154(b) by 106 days.

(21) Appl. No.: 14/056,534

(22) Filed: Oct. 17, 2013

(65) Prior Publication Data

US 2015/0109005 A1 Apr. 23, 2015

(51) Int. Cl.
| | |
|---|---|
| *G01R 31/08* | (2006.01) |
| *G01R 27/08* | (2006.01) |
| *G01R 1/04* | (2006.01) |
| *G01R 1/067* | (2006.01) |
| *G01R 19/00* | (2006.01) |

(52) U.S. Cl.
CPC ....... *G01R 1/0416* (2013.01); *G01R 1/06772* (2013.01); *G01R 1/06788* (2013.01); *G01R 19/0092* (2013.01)

(58) Field of Classification Search
CPC .. G01R 19/00; G01R 1/0416; G01R 1/06772; G01R 19/0092; G01R 1/06788
USPC ........................................ 324/522, 691–724
See application file for complete search history.

(56) References Cited

U.S. PATENT DOCUMENTS

| | | | | |
|---|---|---|---|---|
| 2,700,749 | A | * | 1/1955 | Bird ................................ 324/95 |
| 3,704,429 | A | * | 11/1972 | Sigmon .................. H03B 7/143 |
| | | | | 330/287 |
| 4,629,975 | A | | 12/1986 | Fiorito et al. |
| 5,066,904 | A | | 11/1991 | Bullock |
| 6,181,140 | B1 | * | 1/2001 | Vokey .................. G01R 31/083 |
| | | | | 324/523 |
| 7,242,197 | B2 | | 7/2007 | Satou et al. |
| 2003/0085729 | A1 | * | 5/2003 | Binkley et al. ............... 324/765 |
| 2007/0115008 | A1 | * | 5/2007 | Barth .................... G01R 15/146 |
| | | | | 324/713 |
| 2007/0159186 | A1 | * | 7/2007 | Grund .......................... 324/678 |
| 2008/0231281 | A1 | * | 9/2008 | Fain et al. ..................... 324/322 |
| 2010/0156731 | A1 | * | 6/2010 | Byun ..................... H01Q 13/10 |
| | | | | 343/739 |

FOREIGN PATENT DOCUMENTS

| | | |
|---|---|---|
| EP | 1 073 908 B1 | 3/2004 |
| EP | 0 792 464 B1 | 8/2004 |

* cited by examiner

*Primary Examiner* — Farhana Hoque
(74) *Attorney, Agent, or Firm* — Gordon Stewart

(57) ABSTRACT

A method and apparatus for non-intrusively measuring flowing currents and/or voltage on the inner conductor of a coaxial cable is introduced herein. In particular, a resultant low-impedance element is coupled concentrically to the shield at a desired insertion point of the coaxial cable. A pair of conductive leads provided by the resultant low-impedance element is thereafter monitored for derived flowing currents that are in direct proportion to but of opposite polarity to the current within the inner conductor of the coaxial cable.

15 Claims, 4 Drawing Sheets

US 9,651,576 B2

LOW-SIDE COAXIAL CURRENT PROBE

BACKGROUND OF THE INVENTION

Field of the Invention

The present invention relates to the field of current probes. In particular, the present invention relates to a probe for sensing currents derived from resultant voltages on the low side (ground side) of a coaxial cable system.

Discussion of the Related Art

Conventional configurations in monitoring or probing the current and voltage along a coaxial cable often involves disruption of the coaxial association and/or characteristics of the inner and outer conductors. The most common way of disrupting the association is to use an AC current probe, current transformer/transducer or a resistive element somewhere along the coaxial path. However, the use of such components often impacts the impedance of the cable itself leading to deleterious effects, such as, undesirable reflections in pulsed applications. Moreover, when high voltages are conducted by the transmission line, the inserted component itself is also exposed to the high voltage making the measurement more difficult. Moreover, some inserted components often also include special fittings and adaptors which not only interfere with the purpose of the coaxial conductors, but in doing so, interject cumbersome structures which often affect the versatility of an inherent coaxial cable design.

Background information on a current monitor that includes coaxial cables, is described and claimed in, U.S. Pat. No. 7,4242,197, entitled, "CURRENT MEASURING APPARATUS, TEST APPARATUS, AND COAXIAL CABLE AND ASSEMBLED CABLE FOR THE APPARATUSES," issued Jul. 10, 1996, to Sataou et al., including the following, "[t]here is provided a current measuring apparatus for measuring current-under-measurement flowing between a first measuring terminal and a second measuring terminal, having a plurality of primary coils whose one end is electrically connected with the first measuring terminal and another end thereof is electrically connected with the second measuring terminal, a secondary coil that generates voltage representing the current-under-measurement corresponding to the current-under-measurement flowing through the plurality of primary coils and coaxial cables, each corresponding to the plurality of primary coils and having a signal line that connects one end of the primary coil with the first measuring terminal and a shield, and the coaxial cable has the signal line, an insulating layer for coating the signal line, first one of the shield having a tape-like conductor wound around the insulating layer and second one of the shield made of a conductor provided around the first shield."

Background information on a measuring apparatus for determining energy flow through a coaxial cable, is described and claimed in, EP Patent No. 0,792,464, entitled, "A MEASURING LINE FOR A COAXIAL CONDUCTOR FOR DETERMINING ENERGY THROUGHFLOW AND STANDING WAVE RATIOS" issued Nov. 24, 1998, to Gunnar Persson, including the following, "[a]measuring line (1) for coupling with coaxial contacts (2) comprises a 50 ohms slabline having a centre conductor (3) and on one side thereof a single directional coupler (4) of higher impedance, e.g. 75 ohms, whose ends are coupled with accurate matching, through the medium of carrier cylinders (8), to attenuating and impedance-transforming circuits (30) constructed in accordance with microstrip technique on an externally mounted circuit board (10). The attenuated signal is measured in a circuit which includes a feedback voltage-controlled attenuating circuit."

Background information on an apparatus that utilizes a Rogowski transducer to measure current in a conductor, such as coaxial cable, is described and claimed in, EP Patent No. 1,073,908, entitled, "CURRENT MEASURING DEVICE" issued Mar. 24, 2004, to Frederick et al., including the following, "[a]current measuring device comprising a Rogowski coil (30). Connected across ends of the coil (30) is a passive integrator in two parts (34, 36), the parts being connected by a coaxial cable (32). Connected to the output of the passive integrator (34, 36), is an electronic integrator (38). At low frequencies the passive integrator (34, 36) has a substantially constant gain and the electronic integrator (38) integrates the signal from the coil (30). At high frequencies, the electronic integrator (38) has substantially constant gain and the passive integrator (34, 36) integrates the signal from the coil (30). In order to reduce high frequency voltage oscillations, the Rogowski coil (30) is terminated with a coil damping resistor that has a value that is approximately the same as a characteristic impedance of the coil."

Background information on a coaxial probe that maps current densities of an electron beam, is described and claimed in, U.S. Pat. No. 4,629,975, entitled, "COAXIAL PROBE FOR MEASURING THE CURRENT DENSITY PROFILE OF INTENSE ELECTRON BEAMS" issued Dec. 16, 1986, to Fiorito et al., including the following, "[a]An interceptive type electric probe for mapping the radial current densityrofile of high energy and high current electron beams comprises an input sensor, an interface support connector and an output support connector. The entire structure of the electric probe is configured to closely approximate a coaxial transmission line of a predetermined impedance that is opened ended but yet shielded. The nature of the construction of the probe, in terms of materials and techniques, allows for survival thereof in high temperature and intense beam environments."

Background information on a coaxial current probe, is described and claimed in, U.S. Pat. No. 5,066,904, entitled, "COAXIAL CURRENT SENSORS" issued Nov. 19, 1991, to Donald F. Bullock, including the following, "[a]sensor for measuring large magnitudes of A.C. current utilizes a current divider having parallel conductors and a current comparator coupled to one of the conductors so arranged as to perform first and second stages of scaling of the A.C. current to obtain an output signal from the sensor proportional to the A.C. current. The overall sensor ratio is the product of the ratios of the first and second stages, thereby permitting very large ratios to be obtained. Components of the sensor are arranged so as to cause cancellation of magnetic fields by the sensor and to make the sensor immune from incident magnetic fields."

The present embodiments disclosed herein are directed to a novel coaxial current monitor that capitalizes on the mirror currents that are part of a coaxial cable transmission line. In particular, because of the current within the inner surface of the shield is the image of the inner conductor the coaxial cable, breaking into the shield with configured impedances in a novel manner and measuring resultant voltages across the constructed impedances enables the measurement of a derived current running through the inner conductor of the coaxial cable because of the mirror image current property. In addition, because the mirror image current is being measured via flow through the low impedance portion of the shield, the design(s) herein enable safe measurements even if high voltages are being utilized along the coaxial cable.

SUMMARY OF THE INVENTION

The present invention is directed to a low-side current/voltage probe for measuring transmission line pulses that includes: a transmission line having an inner conductor and an outer concentric conducting shield spaced along the inner conductor; a concentrically configured resistive element having a first end and a second end, wherein the first end and the second end of the concentrically configured resistive element is electrically coupled at an insertion point of the outer concentric conducting shield so as to electrically operate as a low impedance section of the shield; and a first conductive lead coupled to the first end of the concentrically configured resistive element and a second conductive lead coupled to the second end of the concentrically configured resistive element, the first lead and the second lead configured to provide a pair of outputs that can enable a differential signal that is in direct proportion to but of opposite polarity to the current flowing in the inner conductor.

Another aspect of the present application is directed to a method for measuring a derived current of the inner conductor of a transmission line to include: providing a transmission line having an inner conductor and a outer concentric conducting shield spaced along the inner conductor; providing a concentrically configured resistive element at an insertion point of the conducting shield so as to electrically operate as a low impedance section of the shield; and measuring a differential voltage signal across the resistive element; and deriving a conducting shield current from the measured differential voltage, wherein the conducting shield current is in direct proportion to but of opposite polarity to the current flowing in the inner conductor of the transmission line.

DETAILED DESCRIPTION

Figure 1:
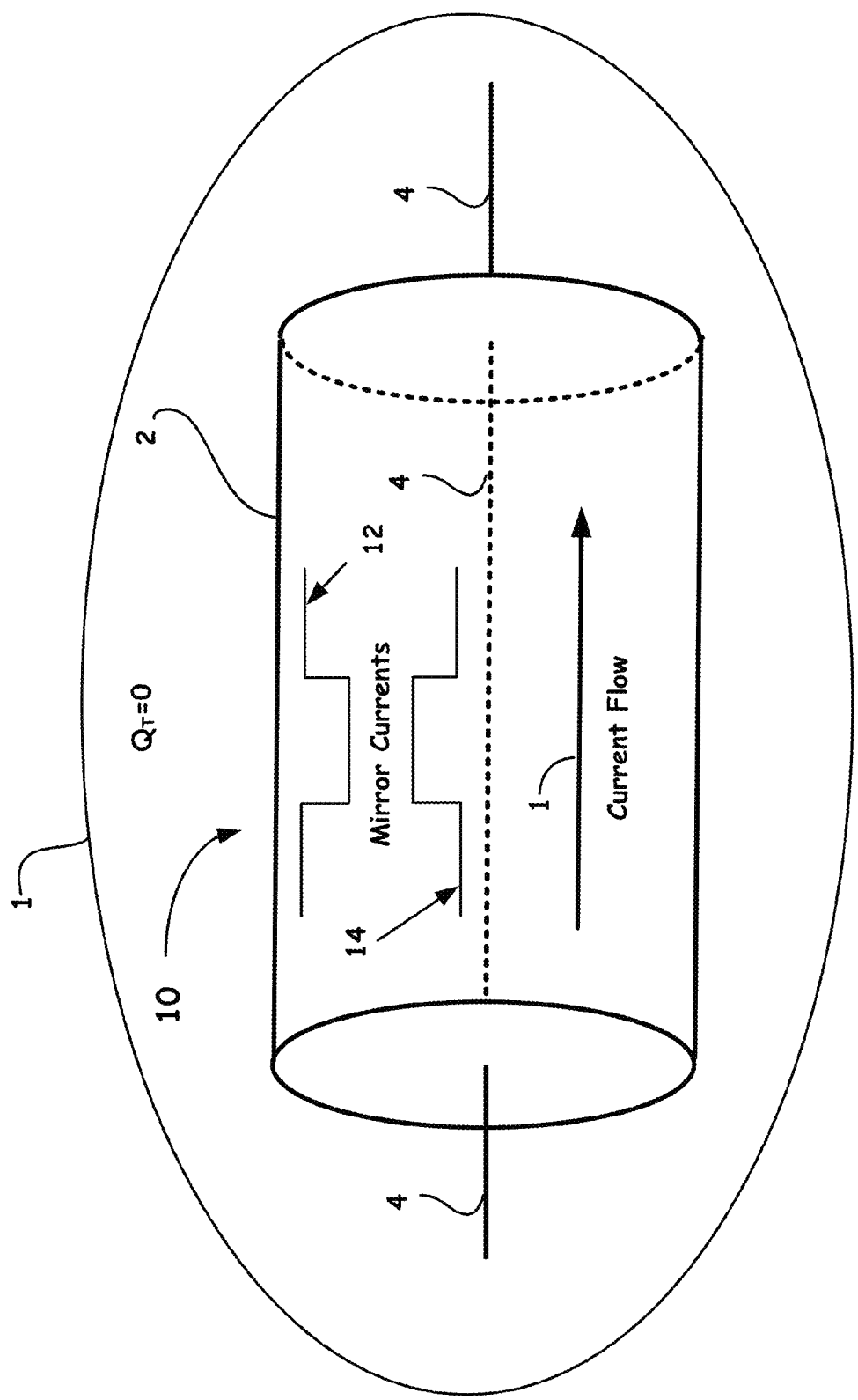
FIG. 1 generally depicts the concept of the total charge (denoted QOr) being zero for an enclosed surface 1 of a coaxial cable.

In the description of the invention herein, it is understood that a word appearing in the singular encompasses its plural counterpart, and a word appearing in the plural encompasses its singular counterpart, unless implicitly or explicitly understood or stated otherwise. Furthermore, it is understood that for any given component or embodiment described herein, any of the possible candidates or alternatives listed for that component may generally be used individually or in combination with one another, unless implicitly or explicitly understood or stated otherwise. Moreover, it is to be appreciated that the figures, as shown herein, are not necessarily drawn to scale, wherein some of the elements may be drawn merely for clarity of the invention. Also, reference numerals may be repeated among the various figures to show corresponding or analogous elements. Additionally, it will be understood that any list of such candidates or alternatives is merely illustrative, not limiting, unless implicitly or explicitly understood or stated otherwise. In addition, unless otherwise indicated, numbers expressing quantities of ingredients, constituents, reaction conditions and so forth used in the specification and claims are to be understood as being modified by the term "about."

Accordingly, unless indicated to the contrary, the numerical parameters set forth in the specification and attached claims are approximations that may vary depending upon the desired properties sought to be obtained by the subject matter presented herein. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the subject matter presented herein are approximations, the numerical values set forth in the specific examples are reported as precisely as possible. Any numerical values, however, inherently contain certain errors necessarily resulting from the standard deviation found in their respective testing measurements.

Specific Description

To provide the reader with a better understanding of the present invention, it is especially known to those skilled in the art that a coaxial cable is an example of a Transverse Electromagnetic (TEM) transmission line. The basic components of a coaxial cable operating as a TEM transmission line, from the inside out, are an inner conductor, a dielectric, a shield layer(s), and often, but not necessarily, a jacket. The shield itself generally serves to keep the desired electrical currents inside, to keep undesired currents outside, to provide a return path for currents and to provide a path to earth ground. It is also known that the skin effect of the inner surface of the shield causes the current of the shield to be concentrated on the inside surface. Also, as part of the known desired characteristics of coaxial cable design, the magnetic fields generated by the concentric inner conductor and the inner surface of the conductive shield cancel outside the shield in both the near and far fields, leaving no net magnetic field outside of the outer conductor that would couple to nearby objects, such as, but not limited to, a core of a nearby transformer that can cause additional losses.

An important aspect to note with respect to the present embodiments herein is that resultant electric as well as the magnetic fields are generated by equal and opposite currents of the inner and the outer conductors (i.e., shield), as separated by the dielectric layer. This aspect can be derived by first recognizing that:

1) $V = \int E \cdot dr$, with V being the potential difference between the inner conductor and the shield, and E being the electric field of the inner conductor.

Applying Gauss's law to the situation of a coaxial cable (i.e., having cylindrical symmetry) in integral form states:

$$2) \; V = \int E \cdot dA = \frac{Q}{\varepsilon_o},$$

with $Q = \lambda dl$ where $\lambda$ is the surface charge density per length dl on the surface of the inner conductor.

Since a coaxial line is indeed utilized in the present invention, through which a current flows in the inner conductor and where the shield of the coaxial cable is held at ground potential, the total charge of the cable is zero, since the electric field from the shield to ground is zero, satisfying Gauss's law equation (20) above as shown by equation (3):

$$3)\ \emptyset_E = \frac{Q_T}{\varepsilon_o} = 0$$

where $\emptyset_E$=Electric Flux, $Q_T$=Total Charge for the enclosed surface of the coaxial cable, and $\varepsilon_o$=the Dielectric Constant.

Thus, because the total charge $Q_T$ must be zero for the enclosed surface of the coaxial cable, this means that an amount of charge equal to the flow of current in the inner (center) conductor of the coaxial cable of which flows along the shield of the coaxial line, is of an opposite polarity to that of the inner conductor, i.e., with a current that is essentially a mirror image. This important aspect is in actuality the key to the present embodiments disclosed herein.

In particular, the present invention capitalizes in a novel fashion on the resultant current that flows through the shield of the coaxial cable so as to accurately not only monitor the "mirror image" current flowing through the inner conductor without substantial disruption of the design and electrical characteristics of the cable but to also beneficially and safely make a measurement of the current running through the inner conductor even in the presence of high voltages.

FIG. 1 exemplifies the concept of how the total charge (denoted $Q_T$) is zero for an enclosed surface 1 of a coaxial cable operating as a transmission line. In particular, FIG. 1 shows a coaxial cable, generally designated by the reference numeral 10, configured with a shield 2 and a current having a flow direction 1 (denoted with a directional arrow) along an inner (center) conductor 4 (dashed line of inner conductor 4 being within the shield 2). Thus, the total enclosed charge $Q_T$ is zero for the coaxial cable 10 in FIG. 1 because the amount of charge equal to the flow of current (shown as a pulse 14) in the inner (center) conductor 4 also flows along the shield 2 of the coaxial line, but of opposite polarity, i.e., a mirror image current pulse 12 to that of the current pulse 14 of the inner conductor 4. As a result, the charges substantially cancel to thus provide for a total enclosed charge (denoted $Q_T$) of zero for the coaxial line. The present embodiments disclosed herein use this mirror image concept to enable the inventive construction of a safe electrical probe that is part of the shield 2 of the coaxial cable 10 so as to monitor the current and/or voltage that is actually running along the related inner conductor of the coaxial transmission line.

Figure 2:
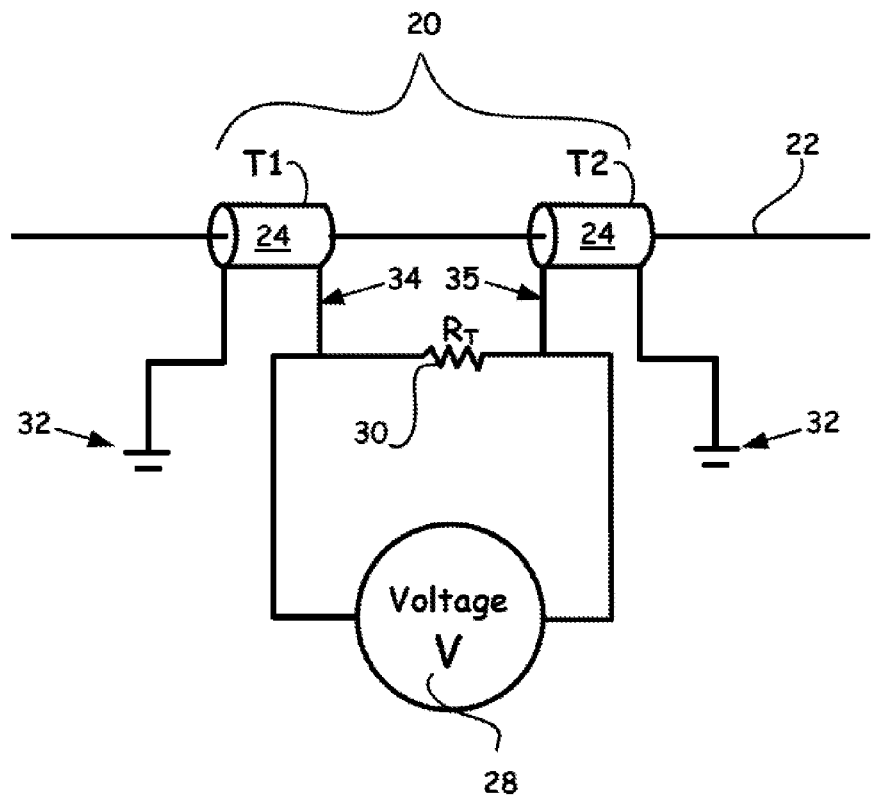
FIG. 2 shows an example configuration of a low-side current probe disclosed herein.

FIG. 2 illustrates a general diagram for probing current in a coaxial cable using a differential voltage measurement across a resistive element along an insertion point of the shield of the cable. Thus FIG. 2 shows the measured voltage (V) 28 across the resistive element 30 ($R_T$ denoting the total resistance) with T1 and T2 generally representing the coaxial line 20 having substantially identical characteristic impedance, with an inner (center conductor) 22 and the shield 24 of the coaxial cable shown electrically coupled to ground 32. From such a measurement, a differential voltage 28 can be utilized to derive (e.g., such as, but not limited to, by use of a math function of an oscilloscope) the value of the current flowing through the shield 24.

The goal of the present application is to provide for a novel high bandwidth current probe of less than 100 ns, more often less than 1 ns, that can unobtrusively sense the current running through the center conductor 22 in the presence of even high voltage-induced fields without disrupting the impedance (measure in ohms) of the coaxial cable (often but not necessarily 50106 ). The current (i.e., voltage) itself in a novel fashion is taken from the shield 24 of the coaxial cable 20 of which is an opposite polarity representation of the current (i.e., voltage) flowing through the center conductor 22. To make such a measurement from the shield 24 of the coaxial cable 20, as disclosed herein, requires that the shield 24, as generally shown in FIG. 2, be grounded (32) and that the resistive element 30 ($R_T$) completely and necessarily covers the inner (center conductor) 22 configured at an insertion point of the shield 24 so as to not disrupt any fields produced within the coaxial cable 20 nor be influenced by any externally produced electric or magnetic fields. Provided conductive leads, e.g., 34 and 35 as shown in FIG. 2, at respectively electrically coupled ends of the inserted resistive element 30 ($R_T$) can be monitored by a data acquisition system, such as but not limited to an oscilloscope (not shown), to enable a differential voltage measurement. For example, conductive leads, e.g., 34 and 35 can be coupled in known manner to those skilled in the art to different input jacks of an oscilloscope having differential measurement capabilities.

As known to those skilled in the art, a differential voltage is "floating," meaning that it has no reference to ground. The measurement herein is thus taken as the voltage difference between the two conductive leads 34 and 35. The main benefit of a differential measurement, as utilized herein, is noise rejection, because noise can often result in both conductive leads 34 and 35 but by using a differential measurement, such noise can be filtered out by the common mode rejection capability of the data acquisition system, such as an oscilloscope.

Thus, as current runs through the center conductor, 22 during desired operation of the coaxial cable of FIG. 2, a coupled data acquisition system, such as an oscilloscope, monitors conductive leads 34 and 35 and provides for the differential voltage (often via a mathematical function inherent in the oscilloscope), and thereafter a derived current can be provided devoid of common noise modes residing in conductive leads 34 and 35 during the measurement(s). It is to be reiterated that the derived current measured at the insertion point of the shield 24 has the opposite polarity of the current flowing through the center conductor 22 by the nature of measuring the correlated current in the shield 24 and not directly the current flowing in the center conductor 22 of the coaxial cable 20, as disclosed herein. In any case, the signal as measured from the insertion point of the shield 24, as shown in FIG. 2, can be inverted and conditioned when required.

As stated above, an important aspect of the low-side current probe, as disclosed herein, is that the inserted resistive element 30 ($R_T$) be arranged with an impedance that does not disturb the characteristics of the coaxial cable. The inserted resistive element 30 ($R_T$) is thus desirably configured with an impedance value measured in ohms that is about less than +/−5% of the shield of a coaxial cable, whatever the coaxial cable that is chosen for a particular application, e.g., 25Ω, 50Ω, 75Ω, 100Ω, 125Ω, 150Ω, 500Ω, 1 kΩ, etc., in order to provide such a result. As a beneficial result, the +/−5% impedance value chosen for the inserted resistive element 30 ($R_T$) enables the safe measurement of high currents flowing through the center conductor during operation. Choosing a particular impedance of a given coaxial cable, and thus the impedance of the inserted resistive element 30 ($R_T$) provides for additional information in certain applications, such as, for example, Transmission-Line Pulse (TLP) device testing applications.

Just as importantly, as also stated above, is that the inserted resistive element 30 ($R_T$) be coupled to the shield of the chosen coaxial cable and thus be part of the shield in a manner that completely and necessarily covers the center conductor so as to not disrupt any fields produced within the coaxial cable nor be influenced by any externally produced electric or magnetic fields. To make this requirement entails constructing the inserted resistive element 30 ($R_T$) often, but not necessarily, from resistive components, such as, but not limited to, carbon, metal, or even films (e.g., metal oxide films). The coupling to the shield can include any manner known to those skilled in the art, such as soldering, removeable fastening, etc., as long as the associated fields themselves and the impedance characteristics of the coaxial cable are not disrupted.

Figure 3:
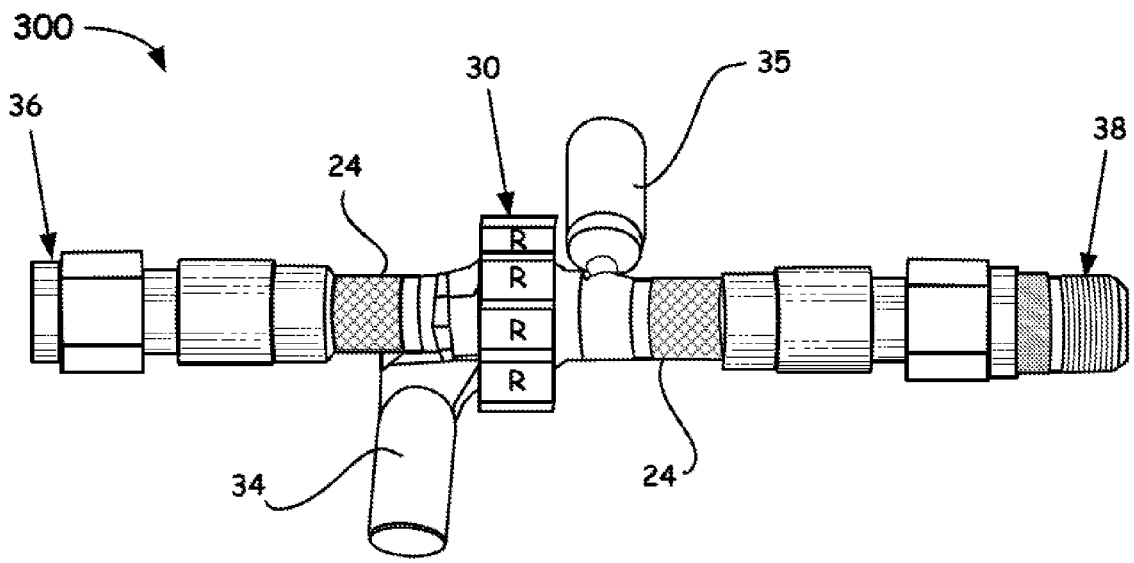
FIG. 3 shows an example embodiment of a constructed low-side current measurement probe of the present application.

FIG. 3 thus shows for illustration purposes, an example embodiment of a constructed low-side current measurement probe, generally designated by the reference numeral 300, which is capable of being utilized for sensing the center conductor current in a coaxial cable. A number of like reference characters used in FIG. 2 are also used in FIG. 3 for simplicity. Thus, example probe 300 of FIG. 3, shows a female input connector 36 (e.g., to be coupled to a charge line of a Transmission-Line Pulse System (TLP)), a male output connector 38 (e.g., to be coupled to part of transmission line of TLP), the shield 24 of the coaxial cable (center conductor runs along probe 300 and is not shown in FIG. 3), resistive element 30 (now shown as a plurality of resistor components denoted as R) and conductive leads 34 and 35 directly coupled to shield 24 (not explicitly shown coupled in FIG. 3) while also coupled to a data acquisition system (e.g., an oscilloscope (not shown)) so as to provide voltage interrogation across resistive element 30.

To completely cover the center conductor (not shown) of the coaxial current probe 300, the resistive element is, (in this example embodiment), constructed from a plurality of resistive elements, (e.g., carbon resistors) arranged in parallel but circumferentially across (at an insertion point) the shield of coaxial cable. Thus a predetermined section of the shield of the cable is removed to enable insertion of the one or more resistive components R. To provide for a desired resistance at less than +/−5% of the impedance of the coaxial cable (here a 50Ω cable) and also completely encircle the center conductor efficiently, the example parallel arrangement herein entailed about ten 1Ω resistors soldered (can also be removeably fastened via mechanical means) to the shield 24 to provide a total resistance (i.e., $R_T$) of about 1Ω. Other impedance values from about 1 milliohms up to 10 ohms for the total resistance ($R_T$) can also be utilized without departing from operational requirements, but the configuration shown in FIG. 3 proved more than beneficial. Thus, once utilized in a measurement situation, the voltage can be provided by probe 300 as measured across the arranged resistors R that results in total resistance ($R_T$). Again, the current (and thus corresponding voltages of up to 4 kV) in the center conductor can be thereafter derived from the measured voltage which is in direct proportion to, but of opposite polarity to, the current flowing in the shield.

Figure 4:
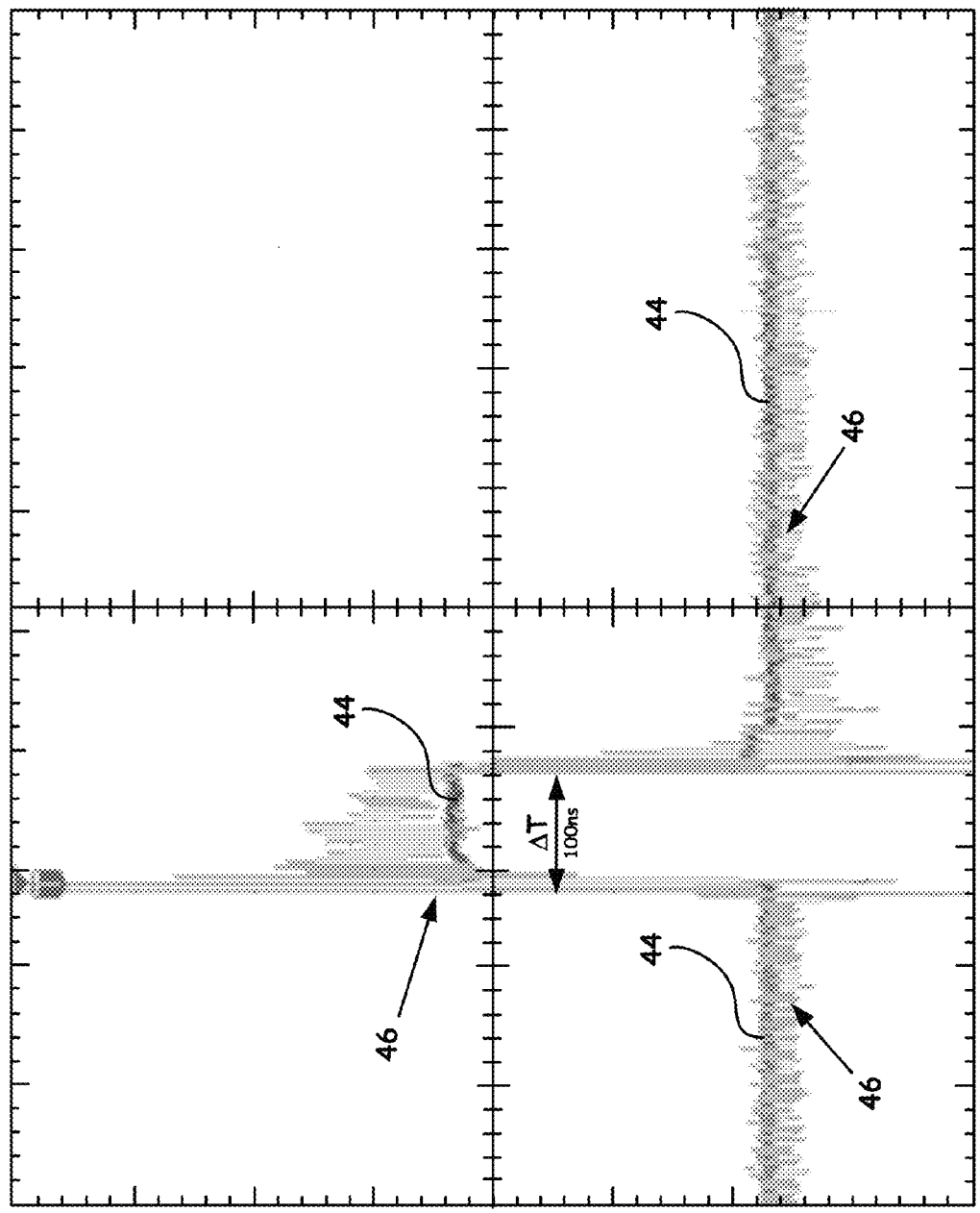
FIG. 4 shows actual data form a differential measurement of current using a constructed low-side current coaxial probe using an oscilloscope on a 100 ns pulse.

FIG. 4 shows a reconstructed but actual oscilloscope measurement as provided by a constructed low-side current probe 300, as shown in FIG. 3. Specifically, FIG. 4 shows a differential measurement using an oscilloscope on a 100 ns pulse (note pulse-width of 100 ns denoted by ΔT in FIG. 4). Even more specifically, FIG. 4 shows two traces 44 (the darker trace) and 46 (the lighter and noisier trace) resultant from a Transmission-Line Pulse (TLP) system that included a 50Ω high voltage pulse generator, a high-speed digital oscilloscope and a computer to control the pulsed events. Such TLP systems, to be discussed in further detail below, are typically used to characterize semi-conductor devices while such devices are subjected to high voltage and high current situations via one or more of a series of substantially flat top profile high voltage pulses, i.e., with desired pulse widths of less than 500 ns, often of pulse-widths of less than 100 ns, more often to measure pulse-widths between 1 ns up to 10 ns, and with rise times on the order of 0.2 ns up to 50 ns. Turning back to FIG. 4, trace 44 is a resultant current pulse that results in a voltage as measured using a current transformer (e.g., a Tektronix CT-1) and trace 46 is taken across a resistive element 30 (i.e., a plurality of parallel resistors), of a probe 300, as similarly shown in FIG. 3 to illustrate the comparative capabilities with well-known inductive current sensors (i.e., the CT-1) currently used by those of ordinary skill in the art.

Figure 5:
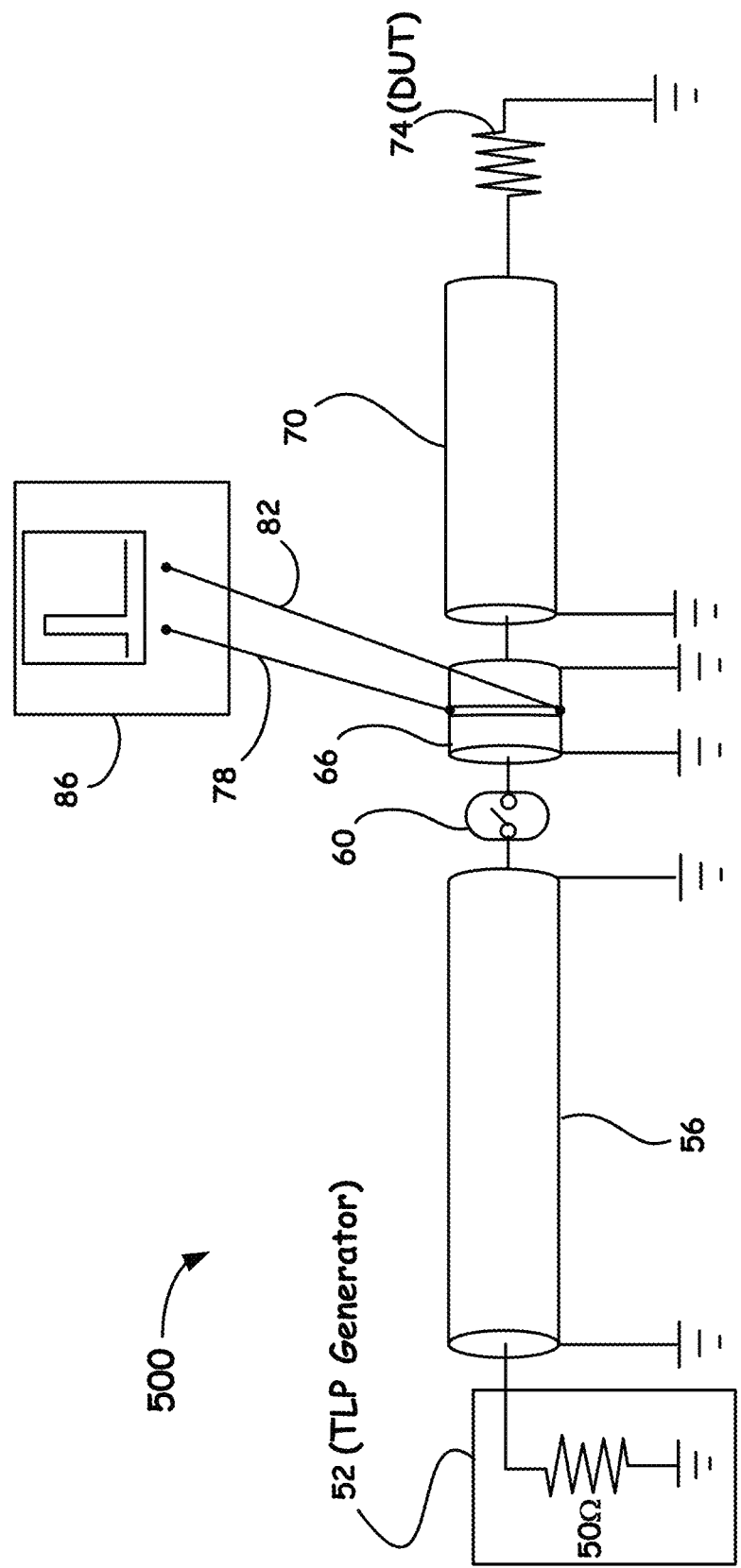
FIG. 5 shows a system application of a low-side current coaxial probe.

FIG. 5 shows an example system that can beneficially utilize an example low-side current probe 300 as shown, for example in FIG. 3 so as to provide the example traces of FIG. 4. In particular, FIG. 5 shows an example TLP system, generally designated by the reference numeral 500 that includes a high voltage source 52 (e.g., a TLP pulse generator), a charge line 56, a switch 60 capable of providing necessary rise-times, a low-side current/voltage probe 66 as disclosed herein, a transmission line 70, and a device under test 74 (also denoted by DUT). Such a system can be beneficially utilized to provide high voltage and high currents to characterize in a pulsed format, semiconductors and associated circuits. It is to be noted that voltage source 52 is shown with an example 50Ω output impedance, of which is common in the art. To increase the voltage and current output, the output from voltage source 52 can be, for example, increased with its output impedance correspondingly decreased. In operation, the voltage source 52 provides charge to coupled charge line 56 of which is impedance matched to source 52. Charge line 56 thereafter behaves as a storage device with the length of charge line 56 being proportional to the pulse-width output of the current pulse. Thus, to change the pulse-width, charge line 56 is exchanged but to change the rise-time, a low-pass filter, i.e., a rise-time filter (not shown) is often integrated along transmission line 70. The switch 60 then closes and the charge on charge line 56 exits and propagates towards the DUT 74 as directed along impedance matched transmission line 70. To characterize the DUT 74, the voltage and derived current is captured by the low-side current/voltage probe 66 by, for example, an oscilloscope 86 using a differential measurement of the outputs 78 and 82 provided by the low-side current/voltage probe 66, as detailed above in the discussion for FIGS. 3 and 4.

TLP testing using system 500, as shown in FIG. 5, conventionally begins with low voltage pulses that are successively increase to provide sufficient points to fill out an I/V curve. Thus, by increasing amplitude pulses, a string of voltage and current measurements enabled by the low-side current/voltage probe 66, as disclosed herein, can often provide useful current/voltage data that aids in characterization (e.g., device behavior) of the devices under test (DUT) 74. The amplitude of the test pulses is increased until the DUT 74 is damaged. Additionally, changing the pulse-width (e.g., longer pulse-widths provide more heating) aids in characterizing how different energy levels can affect the structures (e.g., 74) while changing the rise-time can help determine whether different ramp rates also affect the structures 74. Importantly, the low-side current/voltage probe 66, as presented herein, provides the current and voltage information in an unobtrusive and safe manner to enable such characterization methods.

It is to be understood that features described with regard to the various embodiments described herein may be mixed and matched in any combination without departing from the spirit and scope of the invention. Although different selected embodiments have been illustrated and described in detail, it is to be appreciated that they are exemplary, and that a variety of substitutions and alterations are possible without departing from the spirit and scope of the present invention.

The invention claimed is:

1. A low-side current/voltage probe for measuring transmission line pulses, comprising:
    a transmission line having an inner conductor and an outer concentric conducting shield spaced along the inner conductor;
    a resistive element concentrically configured with the inner conductor and having a first end and a second end, wherein the first end and the second end of the concentrically configured resistive element is electrically coupled at an insertion point of the outer concentric conducting shield so as to electrically operate as a low impedance section of the shield; and
    a first conductive lead coupled to the first end of the concentrically configured resistive element and a second conductive lead coupled to the second end of the concentrically configured resistive element, the first lead and the second lead providing a pair of outputs that can enable a differential signal that is in direct proportion to but of opposite polarity to the current flowing in the inner conductor and that is not referenced to ground.

2. The low-side current/voltage probe of claim 1, wherein the transmission line is a coaxial cable.

3. The low-side current/voltage probe of claim 1, wherein the transmission line is configured with an impedance rated value of 25 ohms up to at least 1000 ohms.

4. The low-side current/voltage probe of claim 1, wherein the resistance element is configured to provide a total impedance value measured in ohms of less than +/−5% of an impedance rated value of the transmission line.

5. The low-side current/voltage probe of claim 1, wherein the resistance element comprises a plurality of metallic resistors configured in parallel.

6. The low-side current/voltage probe of claim 1, wherein the resistance element comprises a plurality of carbon resistors configured in parallel.

7. The low-side current/voltage probe of claim 1, wherein the resistance element comprises a resistive film.

8. The low-side current/voltage probe of claim 1, wherein the resistance element is removeably fastened into the insertion point of the outer concentric conducting shield.

9. The low-side current/voltage probe of claim 1, wherein the resistance element is soldered into the insertion point of the outer concentric conducting shield.

10. The low-side current/voltage probe of claim 1 wherein the outer concentric conducting shield is connected to ground only at positions remote from the first and second leads.

11. A method for measuring a derived current of the inner conductor of a transmission line, comprising:
    providing a transmission line having an inner conductor and an outer concentric conducting shield spaced along the inner conductor;
    providing a resistive element concentrically configured with the inner conductor at an insertion point of the outer concentric conducting shield so as to electrically operate as a low impedance section of the shield; and
    measuring a differential voltage signal across the resistive element; and
    deriving a conducting shield current from the measured differential voltage, wherein the conducting shield current is in direct proportion to but of opposite polarity to the current flowing in the inner conductor of the transmission line and that is not referenced to ground.

12. The method of claim 11, further comprising:
    deriving the conducting shield current from the measured differential voltage by way of a math function of a data acquisition system.

13. The method of claim 11, further comprising: measuring derived current pulses having pulse widths of between 1 ns up to 500 ns.

14. The method of claim 11, further comprising: measuring derived current pulses having pulse widths of less than 1 ns.

15. The method of claim 11, further comprising: measuring derived current pulses having pulse widths of 0.2 ns up to 50 ns.

* * * * *